(12) United States Patent
Chung et al.

(10) Patent No.: US 11,903,169 B2
(45) Date of Patent: Feb. 13, 2024

(54) PORTABLE ELECTRONIC DEVICE

(71) Applicant: ASUSTeK COMPUTER INC., Taipei (TW)

(72) Inventors: Cheng-Han Chung, Taipei (TW); Ching-Yuan Yang, Taipei (TW); Chui-Hung Chen, Taipei (TW)

(73) Assignee: ASUSTeK COMPUTER INC., Taipei (TW)

(*) Notice: Subject to any disclaimer, the term of this patent is extended or adjusted under 35 U.S.C. 154(b) by 0 days.

(21) Appl. No.: 17/960,827

(22) Filed: Oct. 6, 2022

(65) Prior Publication Data
US 2023/0146797 A1    May 11, 2023

(30) Foreign Application Priority Data

Nov. 9, 2021    (TW) .................................. 110141619

(51) Int. Cl.
| | |
|---|---|
| G06F 1/16 | (2006.01) |
| H05K 5/00 | (2006.01) |
| H05K 7/00 | (2006.01) |
| H05K 7/20 | (2006.01) |
| G06F 1/20 | (2006.01) |

(52) U.S. Cl.
CPC ......... *H05K 7/20418* (2013.01); *G06F 1/203* (2013.01)

(58) Field of Classification Search
CPC ........... H05K 7/20418; H05K 7/20409; H05K 7/2039; H05K 7/2049; G06F 1/203; G06F 1/206; G06F 1/20
See application file for complete search history.

(56) References Cited

U.S. PATENT DOCUMENTS

| | | | |
|---|---|---|---|
| 8,976,524 B2 | 3/2015 | Wang et al. | |
| 9,317,064 B2* | 4/2016 | Wu .................... | G06F 1/1616 |
| 10,120,412 B2* | 11/2018 | Chen ................... | G06F 1/1681 |
| 10,824,205 B2* | 11/2020 | Lin ....................... | G06F 1/203 |
| 11,054,872 B2* | 7/2021 | Wu ....................... | G06F 1/1681 |
| 11,163,344 B2* | 11/2021 | Huang ................. | G06F 1/1681 |
| 11,447,992 B2* | 9/2022 | Wang .................. | G06F 1/1681 |

(Continued)

FOREIGN PATENT DOCUMENTS

| | | |
|---|---|---|
| CN | 201925330 | 8/2011 |
| CN | 202597440 | 12/2012 |

(Continued)

*Primary Examiner* — Anthony M Haughton
(74) *Attorney, Agent, or Firm* — JCIPRNET

(57) ABSTRACT

The disclosure provides a portable electronic device, including: a housing, a heat dissipation component, a bracket, a cover structure, and a plurality of pivotal linkage rods. The housing includes a heat dissipation opening. The heat dissipation component is disposed in the housing and corresponds to the heat dissipation opening. The bracket is disposed in the housing and encloses the heat dissipation component. The cover structure is configured to move between a close position covering the heat dissipation opening and an open position exposing the heat dissipation opening. Each of the plurality of pivotal linkage rods is pivotally connected between the bracket and the cover structure, and is configured to be driven to rotate, to drive the cover structure to move between the close position and the open position.

10 Claims, 8 Drawing Sheets

(56) References Cited

U.S. PATENT DOCUMENTS

| | | | |
|---|---|---|---|
| 2015/0016057 A1* | 1/2015 | Fu ........................... | G06F 1/203 |
| | | | 60/527 |
| 2019/0250674 A1* | 8/2019 | Lin ....................... | G06F 1/1616 |
| 2019/0278345 A1* | 9/2019 | Ye ....................... | H05K 7/20181 |
| 2021/0089077 A1* | 3/2021 | Wang .................... | G06F 1/3287 |
| 2021/0286416 A1* | 9/2021 | Huang .................. | G06F 1/1616 |
| 2022/0171439 A1* | 6/2022 | Lin ....................... | G06F 1/1681 |

FOREIGN PATENT DOCUMENTS

| | | |
|---|---|---|
| CN | 103176526 | 5/2016 |
| CN | 103970205 | 10/2017 |
| CN | 111158432 | 5/2020 |
| CN | 212057209 | 12/2020 |
| TW | M302245 | 12/2006 |
| TW | 200803700 | 1/2008 |
| TW | I470408 | 1/2015 |
| TW | M615481 | 8/2021 |

\* cited by examiner

PORTABLE ELECTRONIC DEVICE

CROSS-REFERENCE TO RELATED APPLICATION

This application claims the priority benefit of Taiwan application serial No. 110141619, filed on Nov. 9, 2021. The entirety of the above-mentioned patent application is hereby incorporated by reference herein and made a part of the specification.

BACKGROUND OF THE INVENTION

Field of the Invention

The disclosure relates to a portable electronic device.

Description of the Related Art

In recent years, with the advanced development of mobile communication technologies, many novel applications have been created. In addition, various portable electronic devices are constantly being introduced and improved, so that the central processing unit (CPU) of existing portable electronic devices has considerable computing power, and can support the operation of various software with excellent convenience in use. However, in general, for the convenience of carrying and using by users, portable electronic devices such as smartphones, tablet computers or wearable devices are relatively rarely integrated with fans due to a relatively large volume thereof and certain noise generated during operation. Therefore, to maintain the CPU of a portable device to operate with relatively high power and efficiency, additional heat dissipation capabilities need to be provided for the portable device.

BRIEF SUMMARY OF THE INVENTION

The disclosure provides a portable electronic device, which exposes a heat dissipation component in a housing when there is a heat dissipation requirement, to improve the heat dissipation efficiency.

The portable electronic device in the disclosure includes a housing, a heat dissipation component, a bracket, a cover structure, and a plurality of pivotal linkage rods. The housing includes a heat dissipation opening. The heat dissipation component is disposed in the housing and corresponds to the heat dissipation opening. The bracket is disposed in the housing and encloses the heat dissipation component. The cover structure is configured to move between a close position covering the heat dissipation opening and an open position exposing the heat dissipation opening. Each of the plurality of pivotal linkage rods is pivotally connected between the bracket and the cover structure, and is configured to be driven to rotate, to drive the cover structure to move between the close position and the open position.

Based on the above, the housing of the portable electronic device in the disclosure includes the heat dissipation opening and the cover structure. The heat dissipation opening is configured to expose at least part of the heat dissipation component in the housing, and further drive the cover structure to move via the plurality of pivotal linkage rods pivotally connected between the bracket and the cover structure, to cover or expose the heat dissipation opening. In addition, components such as the cover structure and the pivotal linkage rods are modularly assembled in the portable electronic device via the bracket. With this configuration, when the portable electronic device has a relatively high heat dissipation requirement, the cover structure is opened manually or automatically, to promote heat dissipation. Therefore, the portable electronic device has better heat dissipation efficiency, and the modular design simplifies complex assembly steps.

DETAILED DESCRIPTION OF THE EMBODIMENTS

Figure 1:
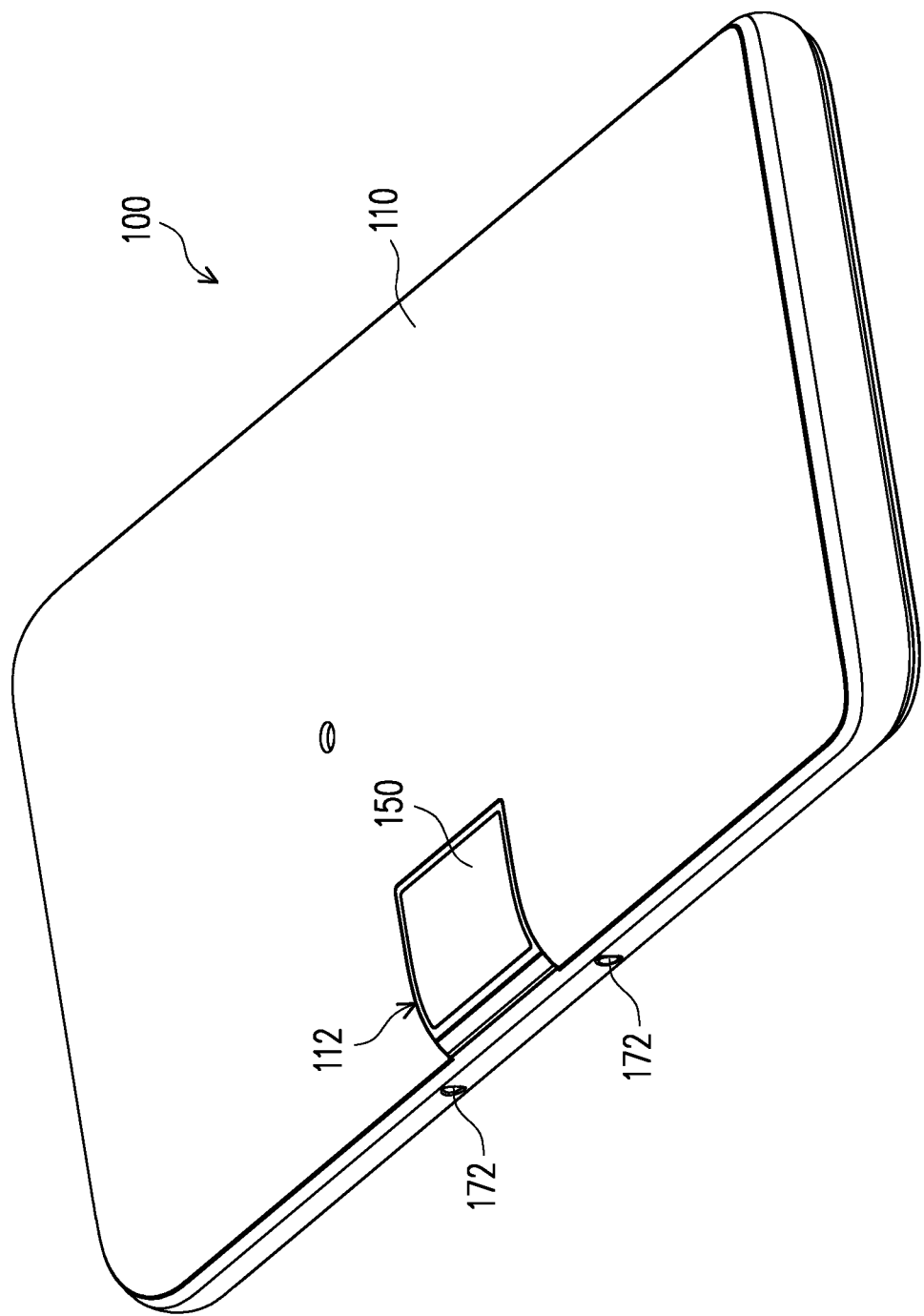
FIG. 1 is a schematic diagram of a portable electronic device according to an embodiment of the disclosure.
Figure 2:
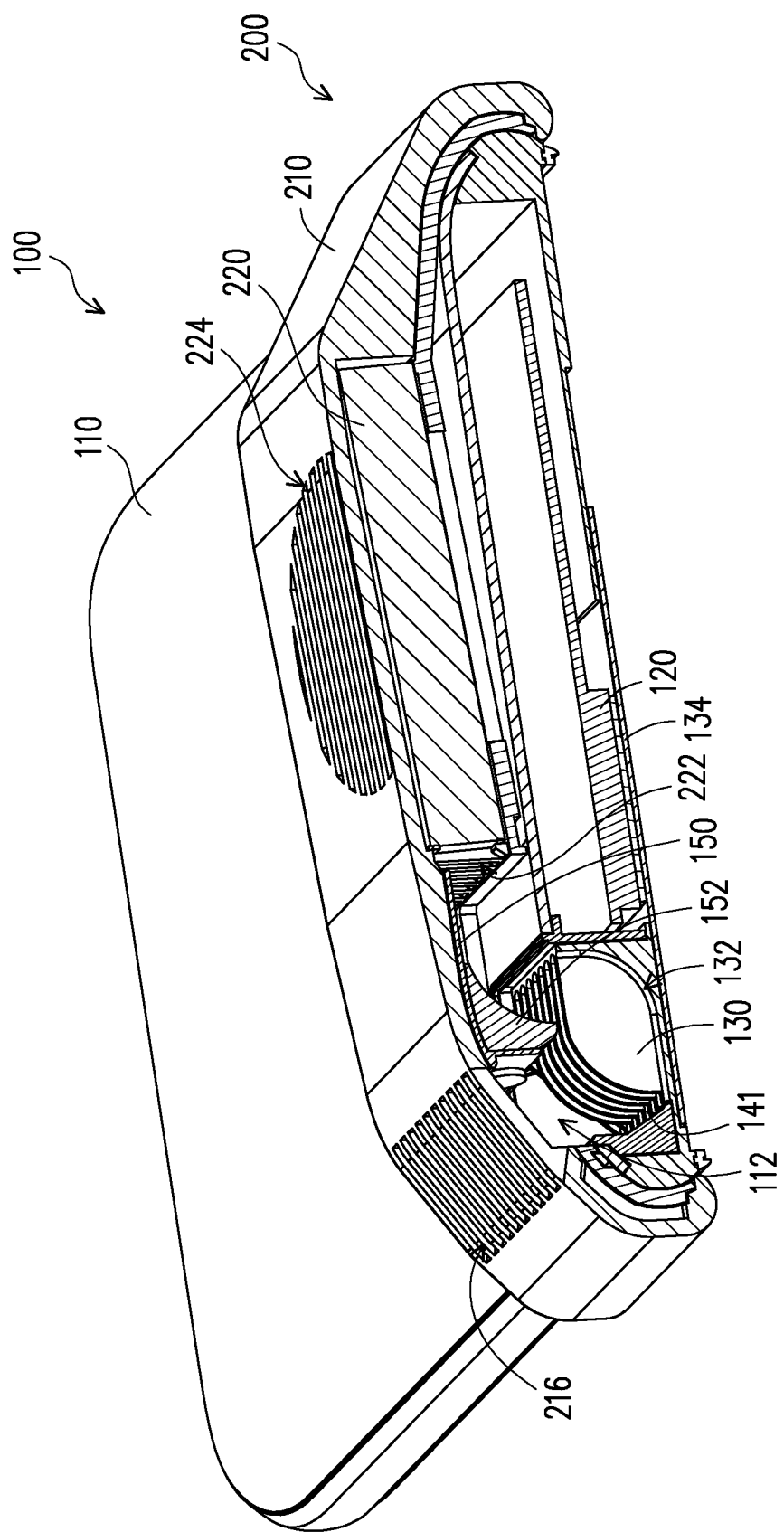
FIG. 2 is a schematic cross-sectional view of a portable electronic device cooperating with a fan module according to an embodiment of the disclosure.

The content of the disclosure is described in detail below by using different drawings. Referring to FIG. 1 and FIG. 2 together, in some embodiments, a portable electronic device 100 is a smartphone, a tablet computer, a wearable device, or the like. The portable electronic device 100 includes a housing 110, a heat generating component 120, a heat dissipation component 130, a bracket 140, a plurality of pivotal linkage rods 160, and a cover structure 150. The housing 110 is configured to define an accommodating space, and includes a heat dissipation opening 112 on a surface thereof. In this embodiment, the heat dissipation opening 112 is located on a rear surface of the portable electronic device 100. The heat generating component 120 is disposed in the accommodating space defined by the housing 110. In some embodiments, the heat generating component 120 is a CPU of the portable electronic device 100 or a heat generating component of another type, and is configured on a circuit board in the housing 110. The heat dissipation component 130 includes a heat dissipation fin set, which is thermally coupled to the heat generating component 120. In another embodiment, the heat dissipation component 130 is alternatively configured around the heat generating component 120, and is connected to the heat generating component 120 by using components such as a vapor chamber, to dissipate heat for the heat generating component 120 by using the heat dissipation component 130. In some embodiments, a surface of the heat dissipation component 130 in contact with the heat generating component 120 or the vapor chamber is coated with a thermal paste to improve the thermal conductivity. In an embodiment, the heat dissipation component (fin) 130 is the same as the housing 110 in material, or the heat dissipation component 130 is an extension part of the housing 110. Definitely, in another embodiment, the heat dissipation component 130 is alternatively a separate heat dissipation (fin) part, which is fixed in the portable electronic device 100 by welding or the like.

In some embodiments, the heat dissipation component 130 is disposed in the housing 110 and corresponds to the heat dissipation opening 112. In other words, the heat dissipation opening 112 of the housing 110 exposes at least part of the heat dissipation component 130 (for example, the heat dissipation fin), to improve the heat dissipation efficiency of the heat dissipation component 130. In this embodiment, the heat dissipation component 130 is a passive heat dissipation component. In some embodiments, the heat dissipation component 130 includes an arc-shaped flow guiding groove 132, and the bracket 140 also includes an arc-shaped flow guiding surface 141 facing the heat dissipation component 130, to define an arc-shaped flow channel with the arc-shaped flow guiding groove 132, so that heat generated by the heat generating component 120 is not remained in the dead area (right angle) inside the housing 110, thereby further improving the heat dissipation efficiency.

Figure 3:
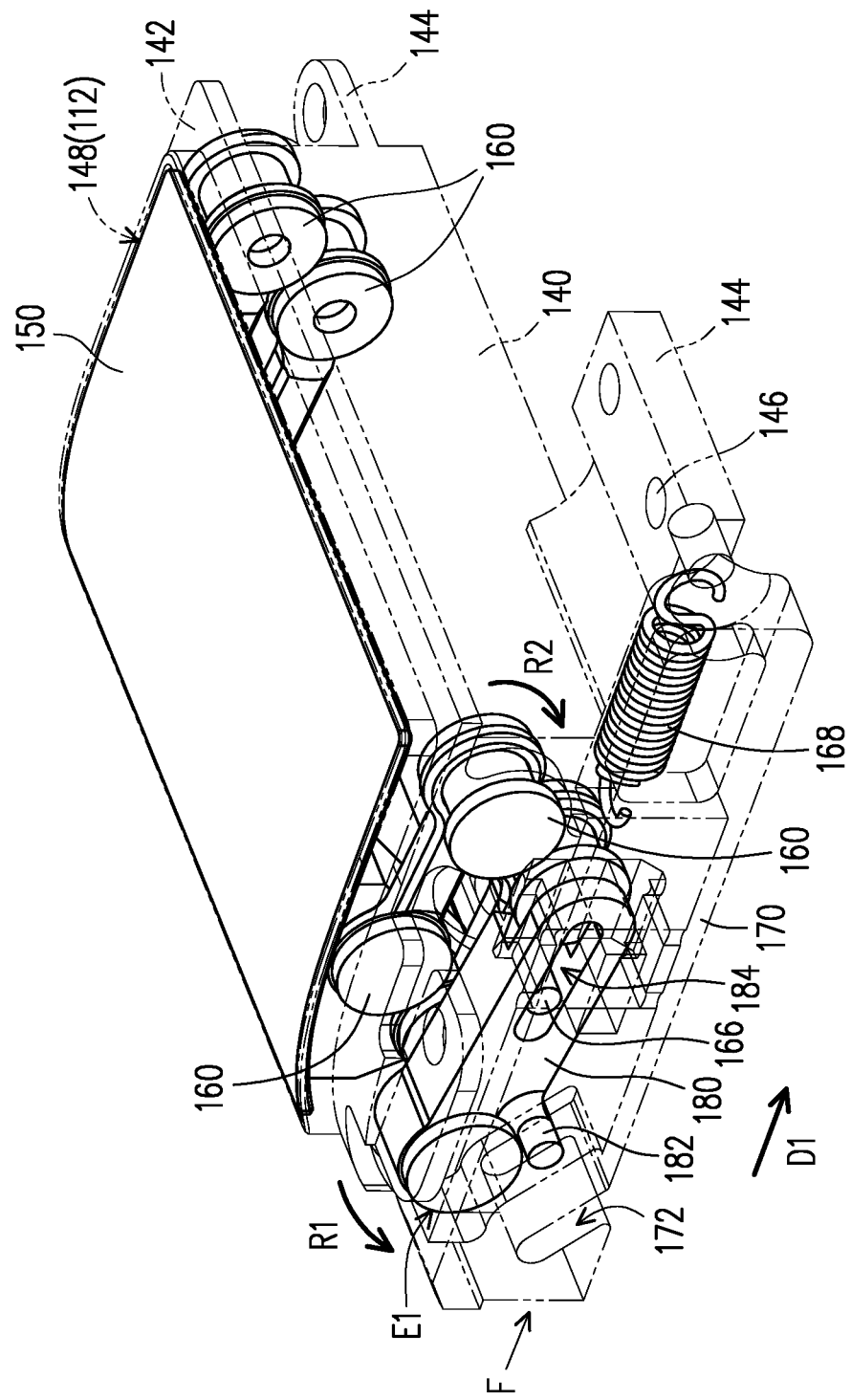
FIG. 3 is a schematic diagram of a cover structure of a portable electronic device at a close position according to an embodiment of the disclosure.
Figure 4:
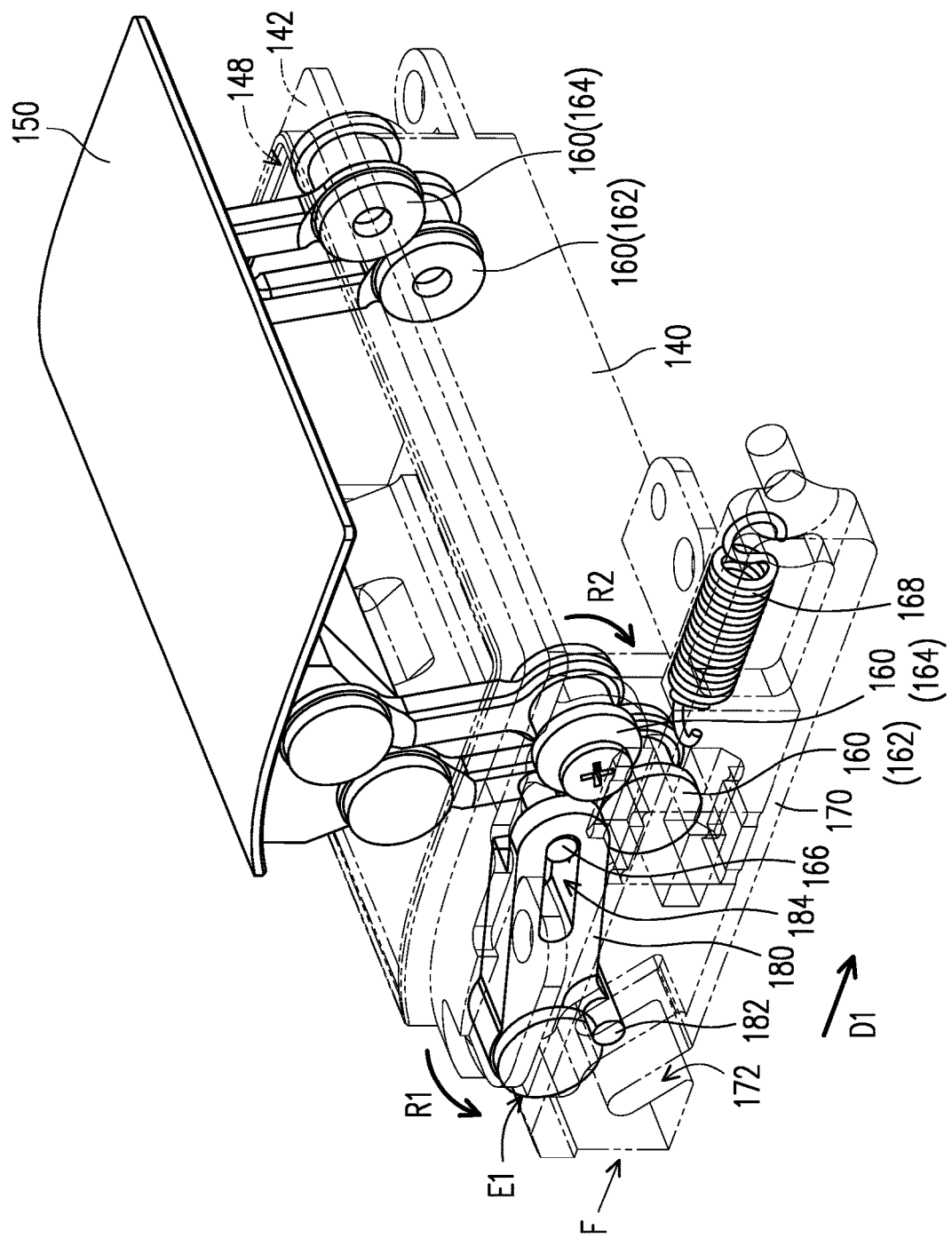
FIG. 4 is a schematic diagram of the cover structure of the portable electronic device in FIG. 3 at an open position.

Referring to FIG. 2 to FIG. 4 together, in some embodiments, the bracket 140 is disposed in the housing 110 and encloses the heat dissipation component 130. In an embodiment, the bracket 140 is locked on a bottom plate in the housing 110 through a locking member 146. In this embodiment, the bracket 140 includes an enclosing portion 142 and a fixing portion 144. The enclosing portion 142 is configured to enclose the heat dissipation component 130 and define a bracket opening 148. The bracket opening 148 corresponds to the heat dissipation opening 112 of the housing 110, to jointly expose the heat dissipation component 130. The fixing portion 144 is disposed around the enclosing portion 142 and includes a locking hole for the locking member 146 to lock.

In some embodiments, the cover structure 150 is coupled to the bracket 140 and corresponds to the heat dissipation opening 112. In this embodiment, the cover structure 150 is configured to be driven to move relative to the bracket 140, to move between a close position (the close position shown in FIG. 3) covering the heat dissipation opening 112 and an open position (the open position shown in FIG. 4) exposing the heat dissipation opening 112 and the heat dissipation component 130 below. In this embodiment, each of the pivotal linkage rods 160 is pivotally connected between the bracket 140 and the cover structure 150, and is configured to be driven to rotate, to drive the cover structure 150 to move between the close position shown in FIG. 3 and the open position shown in FIG. 4.

In some embodiments, the plurality of pivotal linkage rods 160 is respectively arranged on the bracket 140 and opposite sides of the cover structure 150, so that the opposite sides of the cover structure 150 jointly drive the cover structure 150 to move between the close position and the open position. Specifically, the pivotal linkage rods 160 include two pairs of pivotal linkage rods arranged symmetrical to each other, each pair of pivotal linkage rods includes a first pivotal linkage rod 162 and a second pivotal linkage rod 164 arranged parallel to each other on a same side of the cover structure 150, and the first pivotal linkage rod 162 and the second pivotal linkage rod 164 are respectively pivotally connected between the bracket 140 and the cover structure 150. Definitely, the quantity of the pivotal linkage rods 160 is not limited in this embodiment.

Figure 5:
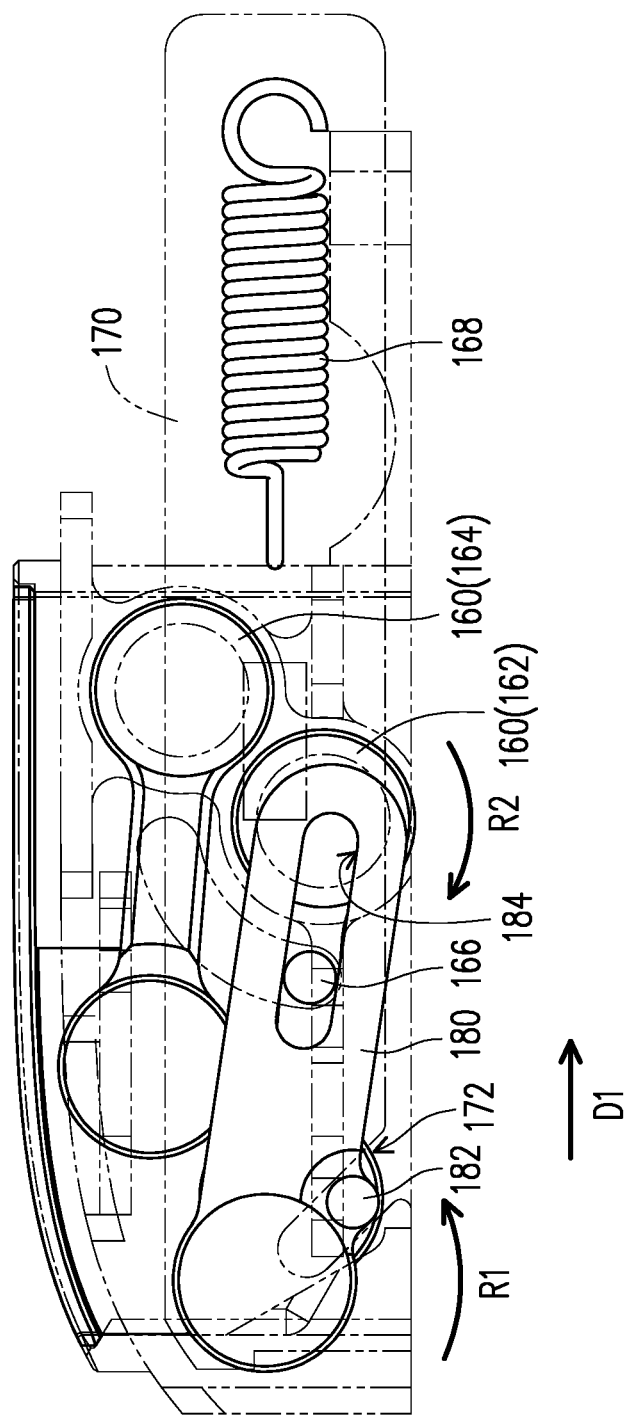
FIG. 5 is a schematic side view of the cover structure of the portable electronic device in FIG. 3 at the close position.

FIG. 5 is a schematic side view of the cover structure of the portable electronic device in FIG. 3 at a close position. Referring to FIG. 3 to FIG. 5 together, in some embodiments, the portable electronic device 100 further includes a pushing member 170 and a driving member 180, where the pushing member 170 is configured to be pushed by an external force F to move toward the pivotal linkage rods 160 to drive the pivotal linkage rods 160 to rotate. The driving member 180 is pivotally connected between the pivotal linkage rods 160 and the pushing member 170. With this configuration, when the pushing member 170 moves toward the pivotal linkage rods 160, the driving member 180 is driven to rotate, thereby driving the pivotal linkage rods 160 to rotate. Specifically, the pushing member 170 includes a guiding groove 172, and the driving member 180 correspondingly includes a bump 182, disposed at an end E1 of the driving member 180 pivotally connected to the bracket 140 and located in the guiding groove 172, the end E1 of the driving member 180 is regarded as a pivot point of the driving member 180, and the movement of the bump 182 drives the pivot point to rotate. With this configuration, when the pushing member 170 moves toward the pivotal linkage rods 160, the bump 182 moves along the guiding groove 172 to be lifted, to drive the driving member 180 to rotate in a first rotation direction R1 (for example, counterclockwise).

In some embodiments, the driving member 180 further includes a sliding groove 184, while one of the pivotal linkage rods (for example, the first pivotal linkage rod 162) correspondingly includes a slider 166 located in the sliding groove 184. With this configuration, when the driving member 180 is driven to rotate in the first rotation direction R1 (for example, counterclockwise), the slider 166 moves along the sliding groove 184 to be lifted, thereby driving the first pivotal linkage rod 162 to rotate in a second rotation direction R2 (for example, clockwise). The second pivotal linkage rod 164 also rotates with the first pivotal linkage rod 162, to jointly drive the cover structure 150 to move from the close position to the open position. In some embodiments, components such as the pivotal linkage rods 160, the pushing member 170, and the driving member 180 are symmetrically arranged on the bracket 140 and opposite sides of the cover structure 150, to improve the stroke smoothness of the cover structure 150 moving between the close position shown in FIG. 3 and the open position shown in FIG. 4.

In this embodiment, the portable electronic device 100 includes a temperature sensor, which is disposed on the heat generating component 120 to sense the temperature of the heat generating component 120. When the temperature sensor senses that the temperature of the heat generating component 120 is higher than a warning temperature, the portable electronic device 100 pops up a reminder, for example, on a display thereof, for users to manually open the cover structure 150 (for example, apply the external force F to push the pushing member 170), to expose the heat dissipation component 130 to help the heat dissipation component 130 dissipate heat. In some embodiments, when the temperature sensor senses that the temperature of the heat generating component 120 is higher than the warning temperature, the portable electronic device 100 also cooperates with another device (for example, a heat dissipation kit such as a fan module) to open or close the cover structure. In another embodiment, the portable electronic device 100 further automatically controls the cover structure 150 to change from the close position to the open position to promote heat dissipation.

Referring to FIG. 2 again, in some embodiments, the portable electronic device 100 cooperates with another heat dissipation kit, to further help the heat generating component 120 and the heat dissipation component 130 dissipate heat. For example, in this embodiment, the portable electronic device 100 includes a fan module 200 sleeved on the housing 110. In this way, the fan module 200 is sleeved on the housing 110 when there is a relatively large heat dissipation requirement, to be combined with the portable electronic device 100 to help the portable electronic device 100 dissipate heat. The fan module 200 includes a base 210 and a fan assembly 220. The base 210 matches at least part of the housing 110 in shape, to be sleeved on the housing 110 of the portable electronic device 100. In addition, the base 210 includes an air outlet 216 corresponding to the heat dissipation opening 112 of the housing 110. In some embodiments, the fan module 200 includes a driving rod, which is, for example, a protruding rod disposed on an inner surface of the base 210, to match at least part of the housing 110 in shape on the base 210, to be sleeved on the housing 110 of the portable electronic device 100. In addition, the driving rod of the fan module 200 pushes against the pushing member 170, to push the pushing member 170 inward in a movement direction D1, thereby driving the cover structure 150 to rotate and to be lifted to the open position, to improve the operation convenience of the device.

In some embodiments, the fan assembly 220 includes at least one fan 221, and when the fan module 200 is sleeved on the portable electronic device 100, the cover structure 150 is located at the open position. In this case, an air outlet 222 of the fan assembly 220 faces the heat dissipation component 130, and the cover structure 150 extends between the air outlet 222 and the heat dissipation component 130. Therefore, the cover structure 150 located at the open position also has a flow guiding effect. In addition, an air inlet 224 of the fan assembly 220 is located on a surface of the fan away from the rear surface of the portable electronic device 100. With this configuration, when the fan module 200 is sleeved on the housing 110, the cover structure 150 is opened for heat dissipation. In addition, the fan assembly 220 provides cooling airflow, and the cooling airflow is guided by the cover structure 150 to flow to the heat dissipation component 130, to help the heat dissipation component 130 dissipate heat.

In some embodiments, the cover structure 150 further includes an arc-shaped guide plate 152, so that cold air provided by the fan assembly 220 flows toward the heat dissipation component 130 under the guide of the arc-shaped guide plate 152. In some embodiments, the heat dissipation component 130 further includes the arc-shaped flow guiding groove 132, and the bracket 140 also includes the arc-shaped flow guiding surface 141 facing the heat dissipation component 130, to define the arc-shaped flow channel with the arc-shaped flow guiding groove 132, so that cold air flows into and out of the housing 110 along the arc-shaped flow channel. In addition, heat generated by the heat generating component 120 is less likely to be remained in the dead area (right angle) inside the housing 110, thereby further improving the heat dissipation efficiency.

In some embodiments, the pivotal linkage rods 160 further include at least one elastic resetting member 168 (drawn as one) connected between the pushing member 170 and the bracket 140, so that after the external force pushing the pushing member 170 disappears, the pivotal linkage rods 160 are pulled back to the close position shown in FIG. 3 through an elastic resetting force of the elastic resetting member. In some embodiments, the elastic resetting member 168 is an extension spring.

Figure 6:
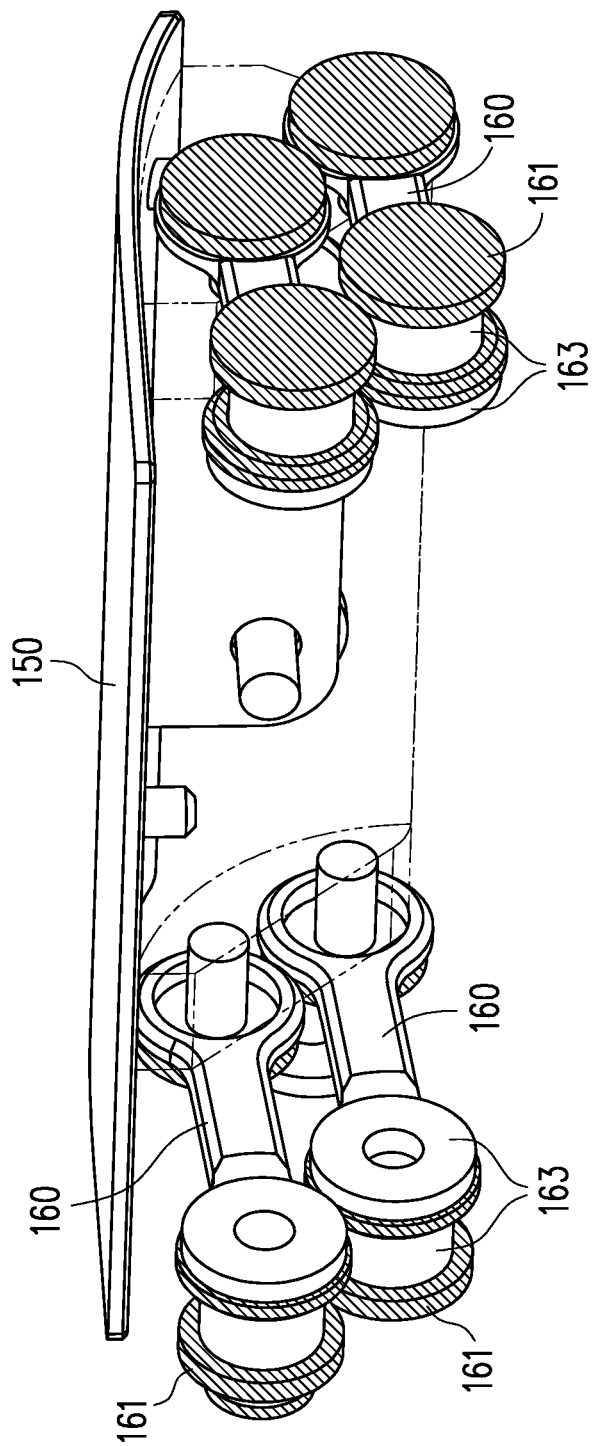
FIG. 6 is a schematic diagram of the cover structure and a pivotal linkage rod of the portable electronic device in FIG. 3.

Referring to FIG. 6, in some embodiments, the portable electronic device further includes a plurality of locking members 161 and a plurality of isolating members 163. The plurality of locking members 161 is, for example, screws, which are respectively connected between the cover structure 150 and the pivotal linkage rods 160 and between the bracket 140 and the pivotal linkage rods 160. The isolating members 163 are, for example, sleeved on the locking members 161 connected between the bracket 140 and the pivotal linkage rods 160, to isolate the locking members 161 from the pivotal linkage rods 160, and prevent the locking members 161 from loosening due to the repeated rotation of the pivotal linkage rods 160 and the friction.

In some embodiments, the locking members 161 are magnetic, for example, magnetic screws. In this embodiment, the portable electronic device 100 further correspondingly includes a magnetic field sensor, which is disposed on, for example, a circuit board, and is configured to determine the state of the cover structure 150 according to changes in the magnetic field of the locking members 161. In this embodiment, the magnetic field sensor is, for example, a Hall sensor. Further, the portable electronic device 100 further includes a processor coupled to the magnetic field sensor. In this way, when the state of the cover structure 150 changes (for example, opens or closes), the locking members 161 move and rotate accordingly. Therefore, the magnetic field sensor senses changes in the magnetic field of the locking members 161 and transmits a sensing signal to the processor accordingly. The processor determines the state of the cover structure 150 accordingly. With this configuration, the processor determines whether the cover structure 150 is in an open or close state according to an angle by which the locking members 161 rotate, and even calculates any position of the cover structure 150 in an opening or closing stroke. Therefore, when the cover structure 150 is abnormally opened due to an impact, an improper product operation or other unexpected forces, the processor is aware through this mechanism and closes the cover structure 150. In addition, this mechanism also controls the cover structure 150 to stay at any angle, to achieve application in a semi-open state.

Figure 7:
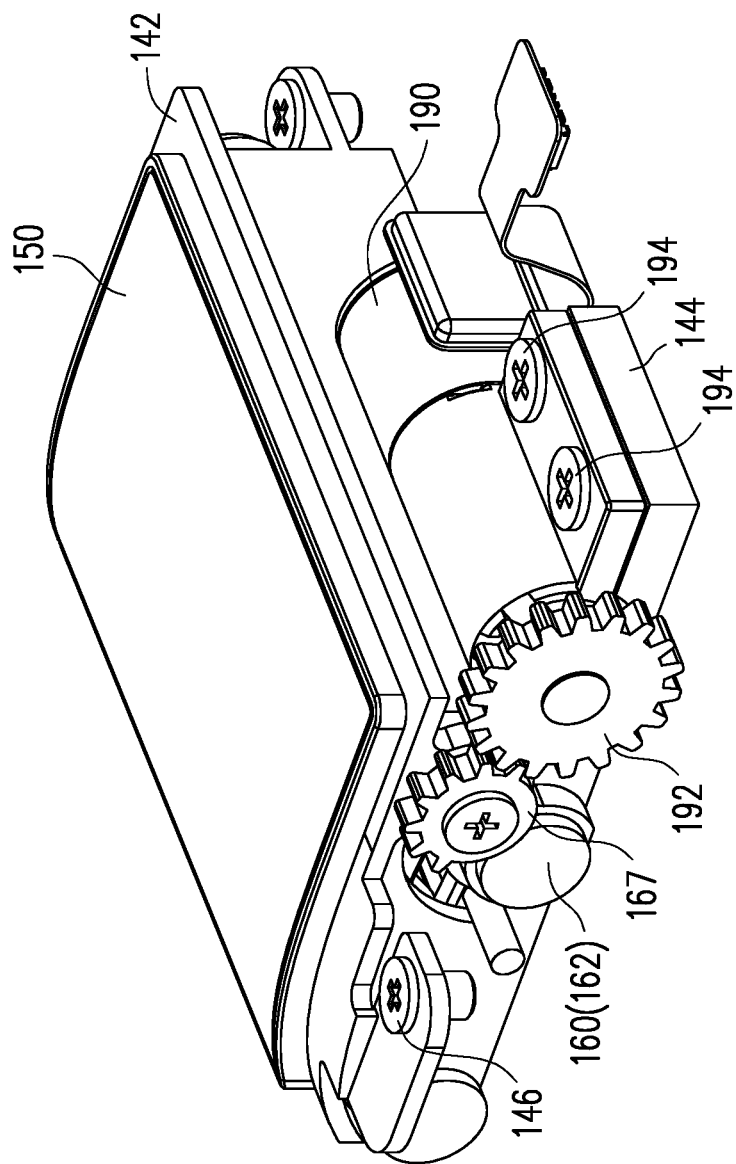
FIG. 7 is a schematic diagram of a cover structure of a portable electronic device at a close position according to another embodiment of the disclosure.
Figure 8:
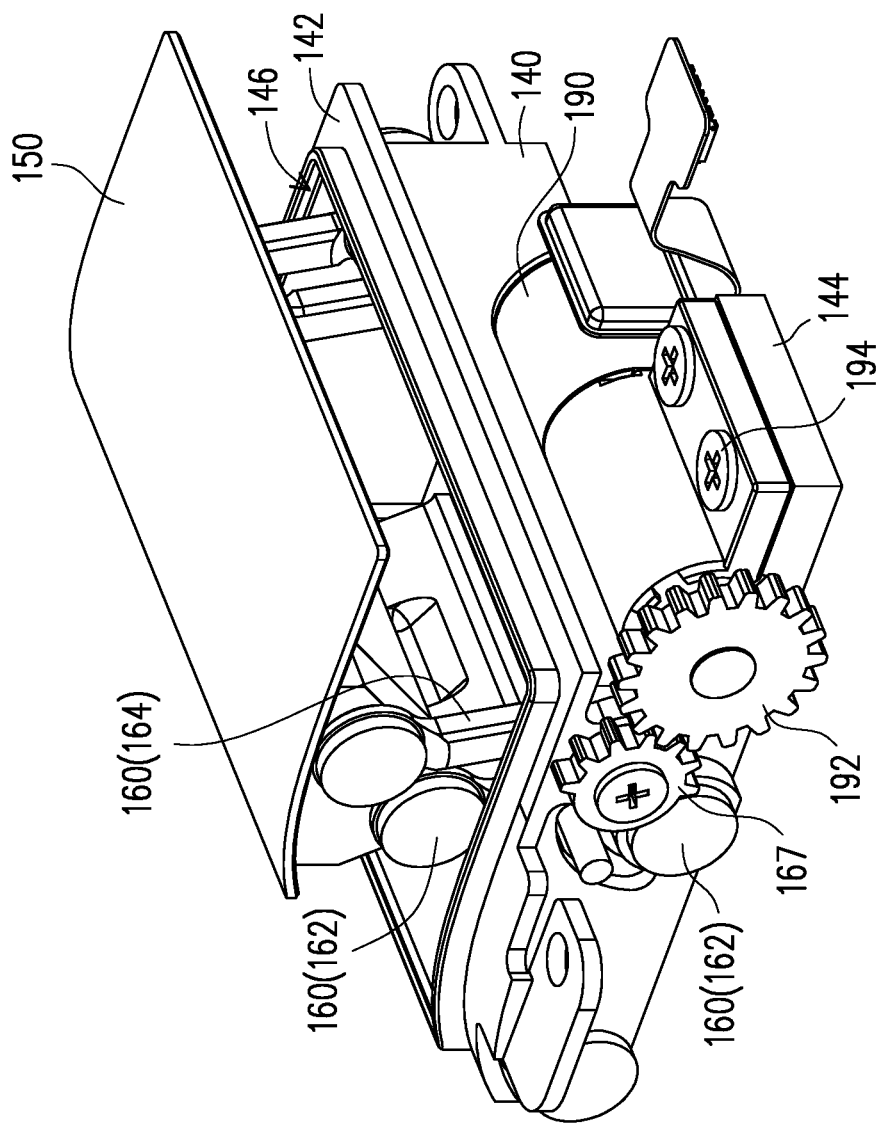
FIG. 8 is a schematic diagram of the cover structure of the portable electronic device in FIG. 7 at an open position.

Referring to FIG. 7 to FIG. 8, in the following embodiments, reference numerals and some content of the foregoing embodiments are used, and same reference numerals are used to represent same or similar elements, and descriptions about same technical content are omitted. In this embodiment, the portable electronic device 100 further includes a motor 190, which is disposed on the bracket 140 and coupled to at least one of the plurality of pivotal linkage rods 160 (for example, the pivotal linkage rod 164), to drive the plurality of pivotal linkage rods 160 to rotate between the close position shown in FIG. 7 and the open position shown in FIG. 8. In an embodiment, the portable electronic device 100 further includes a driving gear 192 and a driven gear 167, where the driving gear 192 is coupled to the motor 190, and the driven gear 167 is coupled to one of the pivotal linkage rods 160 (for example, the pivotal linkage rod 164). In some embodiments, the driving gear 192 of the motor 190 matches the driven gear 167 of the pivotal linkage rods 160 in structure, to drive one of the pivotal linkage rods 160 (for example, the pivotal linkage rod 164) to rotate. With this configuration, the portable electronic device 100 drives the plurality of pivotal linkage rods 160 to rotate through the motor 190, thereby driving the cover structure 150 to move between the close position shown in FIG. 7 and the open position shown in FIG. 8. With this configuration, when the temperature sensor of the portable electronic device 100 senses that the temperature of the heat generating component 120 is higher than the warning temperature, a heat dissipation signal is transmitted to the processor. Accordingly, the processor starts the motor 190, to drive the cover structure 150 to automatically change from the close position to the open position, to promote heat dissipation.

In another embodiment, the driving of the motor 190 may also cooperate with the foregoing fan module 200 to control the cover structure 150 to open and close. In an embodiment, the portable electronic device 100 includes a sensing component (for example, a magnetic field sensing component or a pressure/touch sensing component), which is configured to sense whether the fan module 200 is mounted on the portable electronic device 100 or not. When the sensing component senses that the fan module 200 is mounted on the portable electronic device 100, a sensing signal is transmitted to the processor. Accordingly, the processor starts the motor 190, to drive the cover structure 150 to automatically change from the close position to the open position, to promote heat dissipation. In this embodiment, the motor 190 is locked on the bracket 140 through a locking member 194, and the bracket 140 together with the motor is locked in the housing 110 (for example, on the bottom plate in the housing 110) through the locking member 146, to achieve modular assembly. In some embodiments, the driving gear 192 and the driven gear 167 respectively have corresponding teeth, to intermesh and drive each other to rotate. In another embodiment, the driving gear 192 and the driven gear 167 may alternatively be friction gears, to drive each other to rotate through the friction between the two.

As described above, the housing of the portable electronic device in the disclosure includes the heat dissipation opening and the cover structure. The heat dissipation opening is configured to expose at least part of the heat dissipation component in the housing, and jointly drive the cover structure to move via the plurality of pivotal linkage rods pivotally connected between the bracket and the cover structure, to cover or expose the heat dissipation opening. In addition, components such as the cover structure and the pivotal linkage rods are modularly assembled in the portable electronic device via the bracket. With this configuration, when the portable electronic device has a relatively high heat dissipation requirement, the cover structure is opened manually or automatically, to promote heat dissipation. Therefore, the portable electronic device has better heat dissipation efficiency, and the modular design simplifies complex assembly steps. In addition, the modular design enables the entire module to be tested (for example, operation test) before being assembled to the portable electronic device, to improve the product yield.

What is claimed is:

1. A portable electronic device, comprising:
    a housing, comprising a heat dissipation opening;
    a heat dissipation component, disposed in the housing and corresponding to the heat dissipation opening;
    a bracket, disposed in the housing and enclosing the heat dissipation component;
    a cover structure, configured to move between a close position covering the heat dissipation opening and an open position exposing the heat dissipation opening; and
    a plurality of pivotal linkage rods, respectively pivotally connected between the bracket and the cover structure, and configured to be driven to rotate, to drive the cover structure to move between the close position and the open position.

2. The portable electronic device according to claim 1, further comprising: a pushing member, configured to be pushed by an external force to drive the plurality of pivotal linkage rods to rotate.

3. The portable electronic device according to claim 2, further comprising: a driving member, pivotally connected between the plurality of pivotal linkage rods and the pushing member, wherein when the pushing member moves toward the plurality of pivotal linkage rods, the driving member is driven to rotate, thereby driving the plurality of pivotal linkage rods to rotate.

4. The portable electronic device according to claim 3, wherein the pushing member comprises a guiding groove, the driving member comprises a bump, disposed at an end of the driving member pivotally connected to the bracket and located in the guiding groove, and when the pushing member moves toward the pivotal linkage rods, the bump moves along the guiding groove to drive the driving member to rotate.

5. The portable electronic device according to claim 3, wherein the pivotal linkage rods comprise a first pivotal linkage rod and a second pivotal linkage rod that are arranged parallel to each other, the first pivotal linkage rod is pivotally connected between the bracket and the cover structure and is in sliding fit with the driving member, and the second pivotal linkage rod is pivotally connected between the bracket and the cover structure.

6. The portable electronic device according to claim 5, wherein the driving member comprises a sliding groove, the first pivotal linkage rod comprises a slider located in the sliding groove, and when the driving member rotates, the slider moves along the sliding groove to drive the first pivotal linkage rod to rotate.

7. The portable electronic device according to claim 2, further comprising: an elastic resetting member, connected between the pushing member and the bracket.

8. The portable electronic device according to claim 1, further comprising: a motor, disposed on the bracket and coupled to the plurality of pivotal linkage rods, to drive the plurality of pivotal linkage rods to rotate.

9. The portable electronic device according to claim 8, further comprising: a driving gear coupled to the motor and a driven gear coupled to one of the plurality of pivotal linkage rods, wherein the driving gear and the driven gear are meshed with each other to drive the plurality of pivotal linkage rods to rotate via the motor.

10. The portable electronic device according to claim 1, wherein the heat dissipation component further comprises an arc-shaped flow guiding groove, and the bracket further comprises an arc-shaped flow guiding surface facing the heat dissipation component, to define an arc-shaped flow channel with the arc-shaped flow guiding groove.

* * * * *